US010581132B2

(12) United States Patent
Dakhiya et al.

(10) Patent No.: US 10,581,132 B2
(45) Date of Patent: *Mar. 3, 2020

(54) TUNEABLE BAND PASS FILTER

(71) Applicant: Eagantu Ltd., Ra'anana (IL)

(72) Inventors: Michael Dakhiya, Tel Aviv (IL); Roman Joffe, Netanya (IL)

(73) Assignee: Eagantu Ltd., Ra'anana (IL)

( * ) Notice: Subject to any disclaimer, the term of this patent is extended or adjusted under 35 U.S.C. 154(b) by 0 days.

This patent is subject to a terminal disclaimer.

(21) Appl. No.: 16/176,339

(22) Filed: Oct. 31, 2018

(65) Prior Publication Data

US 2019/0067772 A1 Feb. 28, 2019

Related U.S. Application Data

(63) Continuation-in-part of application No. 15/917,120, filed on Mar. 9, 2018.

(60) Provisional application No. 62/504,907, filed on May 11, 2017.

(51) Int. Cl.
| | | |
|---|---|---|
| *H01P 1/203* | (2006.01) | |
| *H01P 7/08* | (2006.01) | |
| *H01P 1/208* | (2006.01) | |
| *H01P 5/02* | (2006.01) | |
| *H03H 7/01* | (2006.01) | |
| *H03H 9/64* | (2006.01) | |
| *H03H 9/05* | (2006.01) | |
| *H03H 9/13* | (2006.01) | |

(Continued)

(52) U.S. Cl.
CPC ........ *H01P 1/20381* (2013.01); *H01P 1/2088* (2013.01); *H01P 5/028* (2013.01); *H01P 7/08* (2013.01); *H03H 7/0115* (2013.01); *H03H 7/175* (2013.01); *H03H 7/1775* (2013.01); *H03H 9/0504* (2013.01); *H03H 9/058* (2013.01); *H03H 9/13* (2013.01); *H03H 9/145* (2013.01); *H03H 9/54* (2013.01); *H03H 9/6406* (2013.01)

(58) Field of Classification Search
CPC .... H01P 1/203; H01P 1/7088; H01P 1/20327; H01P 1/20381
USPC ................................................. 333/204, 205
See application file for complete search history.

(56) References Cited

U.S. PATENT DOCUMENTS

| | | | |
|---|---|---|---|
| 2,892,163 A | 6/1959 | Todd | |
| 5,136,269 A * | 8/1992 | Seitzer | ............... H01P 1/20363 333/204 |
| 5,307,036 A | 4/1994 | Turunen et al. | |

(Continued)

FOREIGN PATENT DOCUMENTS

| | | | |
|---|---|---|---|
| EP | 0285503 A1 * | 10/1988 | ............. H01P 1/203 |
| EP | 0917233 A2 | 5/1999 | |
| RU | 2460207 C2 | 8/2012 | |

OTHER PUBLICATIONS

International Search Report and Written Opinion of International Searching Authority for PCT/US2018/021777, ISA/RU, Moscow, Russia, dated Jul. 23, 2018.

*Primary Examiner* — Rakesh B Patel
(74) *Attorney, Agent, or Firm* — M&B IP Analysts, LLC

(57) ABSTRACT

A tunable band pass filter (BPF), including a first transmission line electromagnetically coupled to a second transmission line, wherein a length of at least one of the first transmission and the second transmission line is adjustable, and wherein a frequency of a passband of the BPF is directly related to the length of the adjustable transmission line.

6 Claims, 8 Drawing Sheets

(51) Int. Cl.
*H03H 9/145* (2006.01)
*H03H 9/54* (2006.01)

(56) References Cited

U.S. PATENT DOCUMENTS

| | | |
|---|---|---|
| 5,497,130 A | 3/1996 | Hirai et al. |
| 5,499,003 A | 3/1996 | Davenport |
| 5,525,942 A | 6/1996 | Horii et al. |
| 5,696,471 A | 12/1997 | Fujiwara |
| 6,215,374 B1 | 4/2001 | Petrovic |
| 6,300,850 B1 | 10/2001 | Kaegebein |
| 6,411,178 B1 | 6/2002 | Matsumura et al. |
| 6,504,451 B1 | 1/2003 | Yamaguchi |
| 7,126,444 B2 | 10/2006 | Fukunaga et al. |
| 2002/0027481 A1 | 3/2002 | Fiedziuszko |
| 2002/0093400 A1* | 7/2002 | Zhu ................... H01P 1/20336 |
| | | 333/205 |
| 2005/0020231 A1 | 1/2005 | Yamada et al. |
| 2008/0117003 A1 | 5/2008 | Soora |
| 2012/0249264 A1 | 10/2012 | Wakata et al. |
| 2013/0106532 A1 | 5/2013 | Jin et al. |
| 2016/0126609 A1 | 5/2016 | Leipold et al. |
| 2018/0115033 A1* | 4/2018 | Motoi ................... H01P 1/203 |

\* cited by examiner

TUNEABLE BAND PASS FILTER

CROSS-REFERENCE TO RELATED APPLICATIONS

This application is a continuation-in-part (CIP) of U.S. patent application Ser. No. 15/917,120 filed Mar. 9, 2018, now pending, which claims the benefit of U.S. Provisional Application No. 62/504,907 filed on May 11, 2017. The above referenced applications are hereby incorporated by reference for all that they contain.

TECHNICAL FIELD

The present disclosure relates generally to band pass filters and, more particularly, to tunable band pass filters having transmission lines of adjustable length, where the adjustment of transmission line length corresponds to an adjustment of permitted passbands and prohibited stopbands.

BACKGROUND

A band pass filter (BPF) is an electronic component that is used for filtering out unwanted frequencies for a connected device. That is, a band-pass filter allows frequencies within a certain range and rejects, or attenuates, frequencies outside that range.

For example, FIG. 1 shows a graph of frequencies passing through an ideal BPF. The bandwidth that is permitted to pass though, i.e., the passband as indicated on the graph, is the range of frequencies that extends from a minimum frequency of $f_1$ to a maximum frequency of $f_2$. The amplitude of the passband, as shown on the vertical axis of the graph, is measured in decibels and indicates the amount of insertion loss, or loss of signal, of the transmitted frequency. An ideal BPF contains zero insertion loss.

The graph indicates a perfectly vertical rejection curve, which allows all of the desired frequencies, or the passbands, to successfully pass through the filter while preventing all of the unwanted frequencies, or the stopbands, from passing through. A perfectly ideal vertical curve creates a distinct cut off point between the stopbands and the passband.

The requirements of a desirable BPF include both low insertion loss and a steep rejection curve. However, unlike an ideal BPF, an actual BPF is unable to create a perfectly vertical rejection curve or zero insertion loss. FIG. 2 shows a graph of frequencies of an actual, non-ideal, BPF. The rejection curve is shallow, both between the minimum frequency and the passband and the maximum frequency and the passband. Additionally, there is insertion loss of allowed frequencies within the passband, e.g., 3 decibels.

Many currently available BPFs employ one or more resonators having resonance of certain frequencies. Signals with frequencies close to the resonant frequencies pass through the filter, while signals farther away are blocked. In the related art, three main designs of current resonators include: (a) resonators based on inductors and capacitors (LC); (b) resonators based on surface and bulk acoustic wave filters (known as SAW and BAW filters); and (c) resonators based on a cavity in a dielectric material.

FIG. 3A shows a diagram of an LC resonator-based BPF using several connected inductors (L1, L2, L3 and L8) and capacitors (C1, C2, C3, C8, and C9). Connected components L1 and C1 and other similar capacitors and inductors are the basic components of LC-resonators. These BPFs often employ multiple LC-resonators that are coupled together, as one resonator is usually insufficient to provide the required or desired rejection curve steepness. Thus, several consecutive and connected resonators are often used together. However, as illustrated in the graph shown in FIG. 3B, the rejection curve produced by such resonators is shallow, resulting in a gradual transition between the stopband and the passband, permitting some unwanted frequencies to pass through while also blocking some desired frequencies, resulting in an inaccurate BPF.

FIGS. 4A and 4B show a SAW and a BAW type of BPF, respectively. These filters are popular designs used in modern wireless communication devices due to their high rejection rate of unwanted frequencies (~30-50 dB in proximity of ~50 MHz to the passband). Namely, they produce, as shown in FIG. 4C, a steep rejection curve. However, the insertion loss created by SAW and BAW filters is often undesirably high. Further, additional limitations exist. Specifically, SAW type filters are only effective for frequencies of up to ~3.5 GHz, but are not available for higher frequency bands that are currently in development for many mobile devices (e.g., 6 GHz, 28 GHz, etc.). Further, BAW type filters can be very expensive to produce and are likewise not effective for the 28 GHz band. Additionally, the passband created by SAW and BAW types of BPF is relatively narrow (between 70 MHz-100 MHz or similar) and cannot be adjusted.

The third type of BPF is based on a cavity in a dielectric material, as shown in FIG. 5A. These filters allow for both a steep rejection curve and low insertion losses. However, due to the physical structure required for optimal performance, such filters are large in size. Evidently, as demonstrated in FIG. 5B, the third type of BPF are often too big for use in many applications, such as smartphones, tablets, wearables, and the like.

In addition to the physical size, the narrow bandwidth is a limiting factor for using a conventional BPF in mobile telephones or smartphones and similar devices. A mobile telephone should operate in the entire frequency band of radio frequency (RF) signals designed to be transmitted and received by the device. In modern communication standards, the frequency band (bandwidth) of mobile (cellular) telephones may include a wide range of frequencies. Typically, such a frequency range extends between 1 GHz and 7 GHz while operating at a multi-band frequency. As discussed above, conventional BPFs cannot meet this demand. In addition, the insertion loss causes poor transmission and reception of RF signals. Further, it is often desirable to have a tunable, or adjustable, BPF that is configured to shift the passband, allowing the tuning of which range of frequencies is permitted depending on the circumstances. Thus, a smaller version of a BPF with low insertion loss, wide passbands, steep rejections curves and adjustable passbands is desirable.

It would therefore be advantageous to provide a BPF that would overcome the limitations noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "certain embodiments" may be used herein to refer to a single embodiment or multiple embodiments of the disclosure.

Certain embodiments disclosed herein include a tunable band pass filter (BPF), including a first transmission line electromagnetically coupled to a second transmission line, wherein a length of at least one of the first transmission and the second transmission line is adjustable, and wherein a frequency of a passband of the BPF is directly related to the length of the adjustable transmission line.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
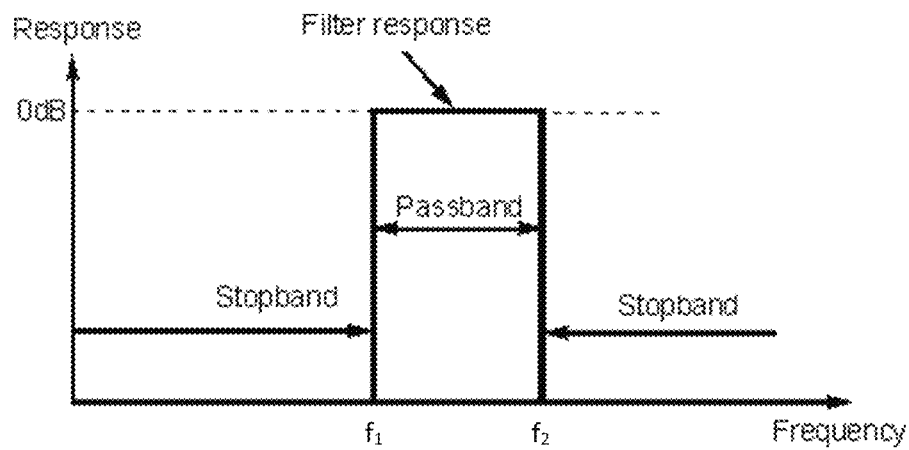
FIG. 1 is a graph of frequencies passing through an ideal band pass filter.
Figure 2:
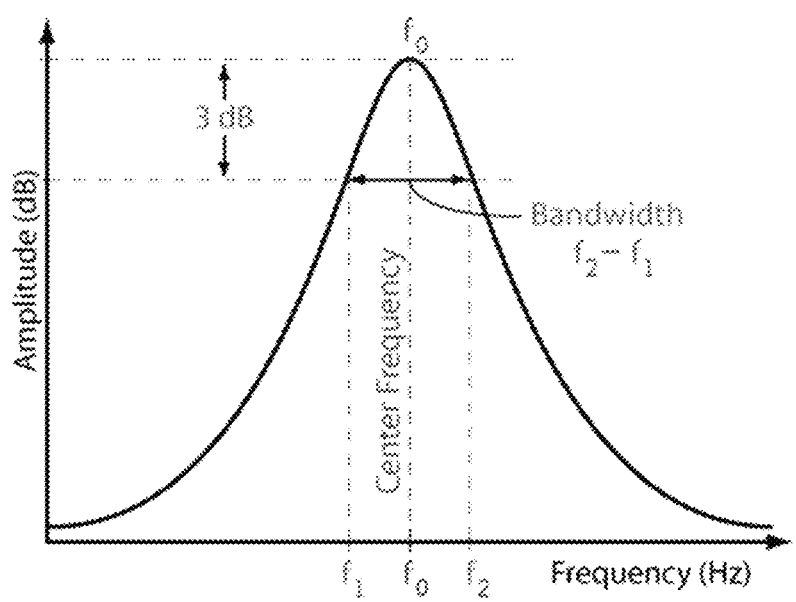
FIG. 2 is a graph of frequencies passing through an example of a non-ideal band pass filter.
Figure 3A:
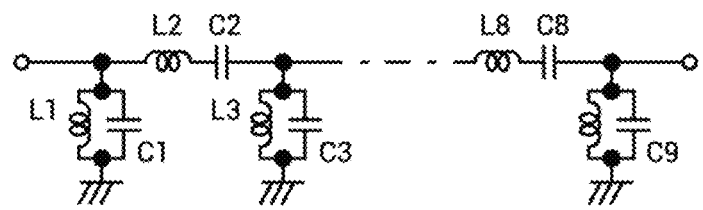
FIG. 3A is an example diagram of an LC resonator band pass filter.
Figure 3B:
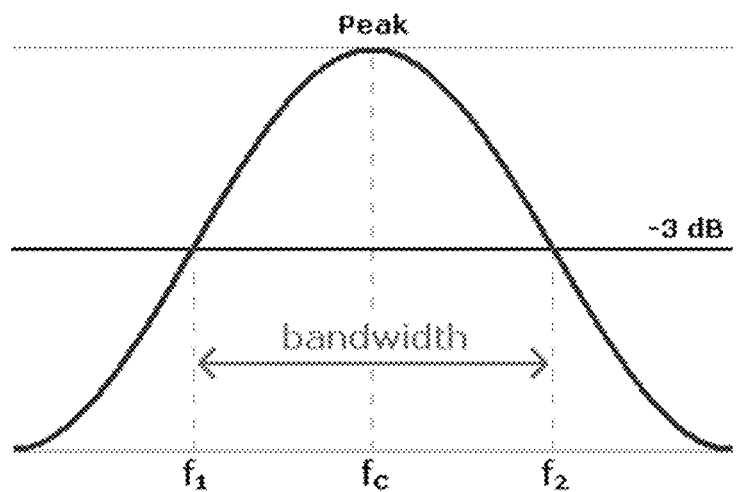
FIG. 3B is a graph of frequencies passing through an example non-ideal LC band pass filter.
Figure 4A:
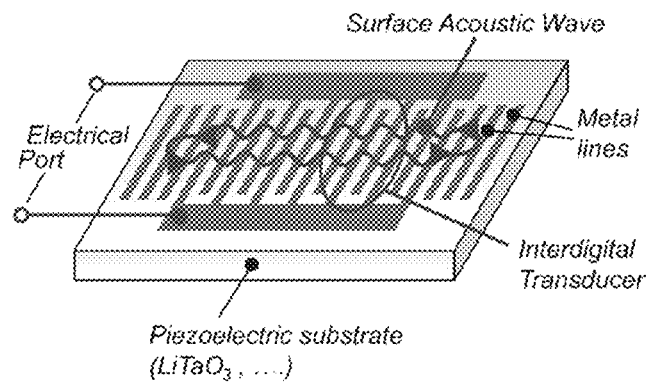
FIG. 4A is an example diagram of a surface acoustic wave band pass filter.
Figure 4B:
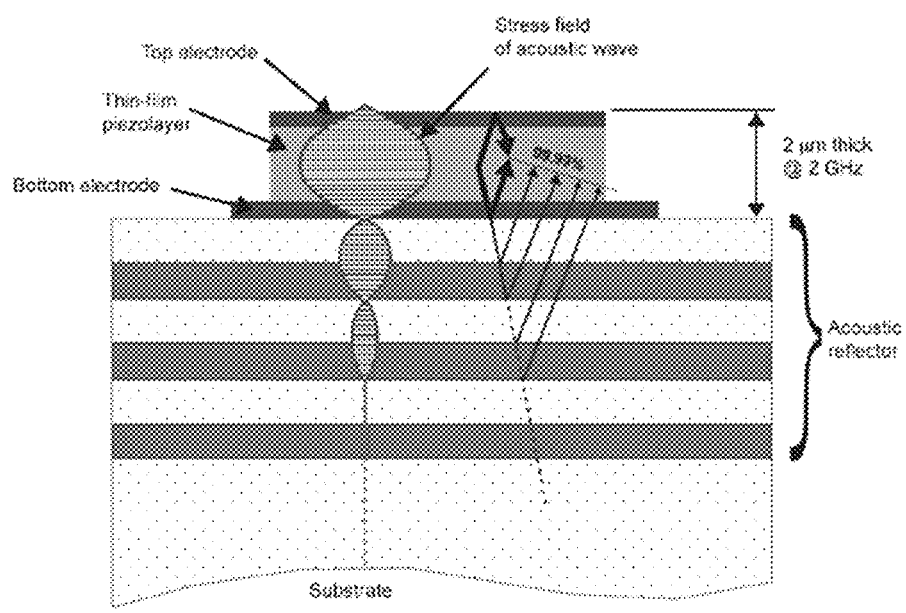
FIG. 4B is an example diagram of a bulk acoustic wave band pass filter.
Figure 4C:
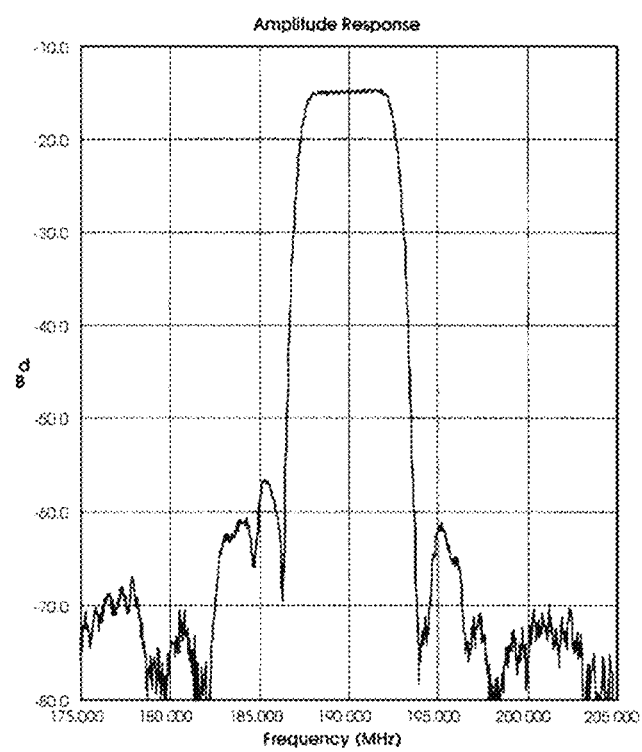
FIG. 4C is a graph of frequencies passing through an example acoustic wave band pass filter.
Figure 5A:
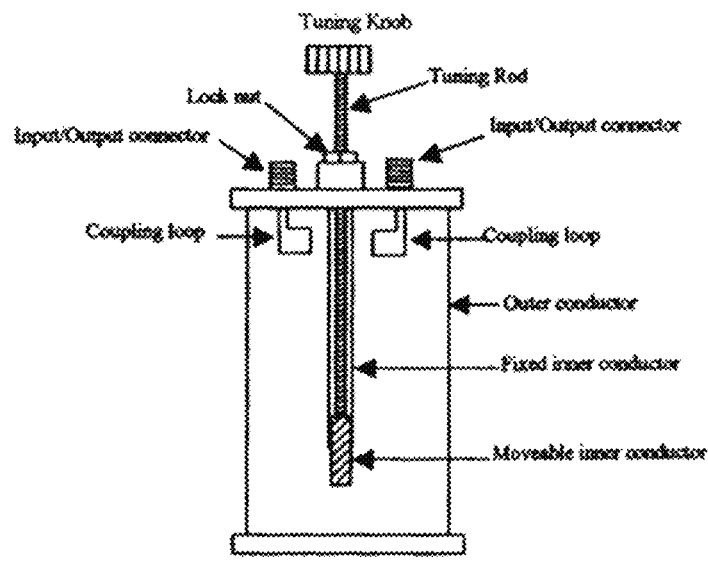
FIG. 5A is an example diagram of a cavity-based band pass filter.
Figure 5B:
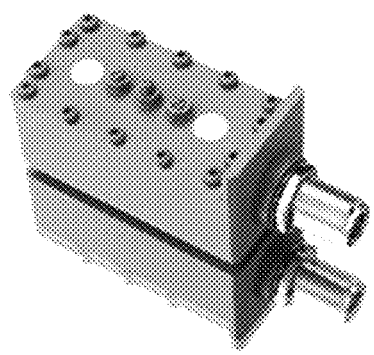
FIG. 5B is an example of a cavity-based band pass filter according to an embodiment.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

Some example embodiments disclosed herein include a tunable band pass filter (BPF) designed to limit the bandwidth of incoming frequencies by permitting passband frequencies while prohibiting stopband frequencies. The tunable BPF disclosed herein can be integrated in hand-held devices such as, but not limited to, a mobile telephone, a smartphone, a tablet computer, a laptop computer, a wearable electronic device, and the like. The BPF can also be integrated in other communication devices, such as radars (e.g., for autonomous car), base-stations, routers, and so on. The proposed design is based physically or theoretically adjusting the length of one or more of the transmission lines, thereby adjusting the central frequency of the passband of the BPF.

Figure 6A:
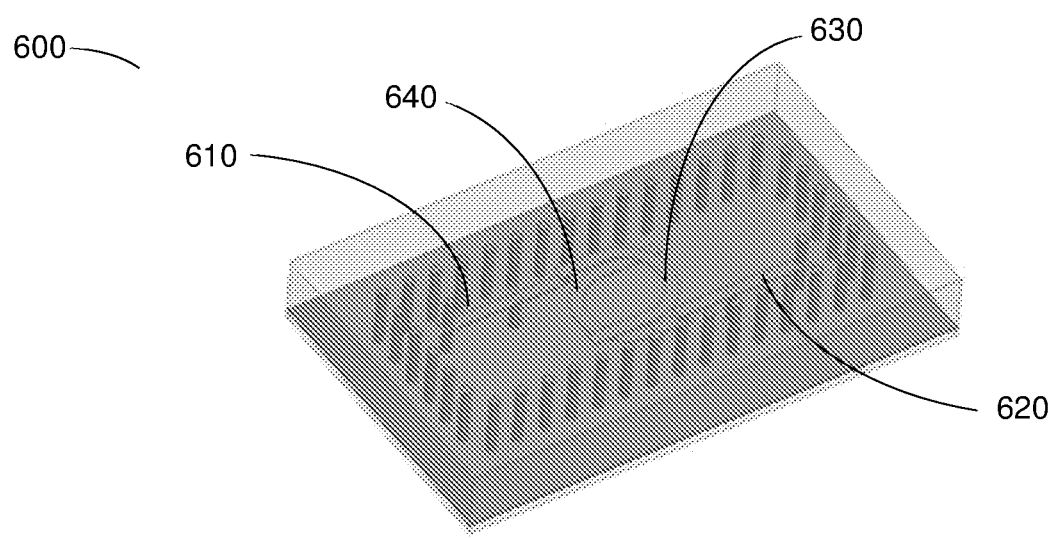
FIG. 6A is an electromagnetically coupled band pass filter according to an embodiment.

FIG. 6A shows an example band pass filter (BPF) 600 designed according to an embodiment. The BPF 600 employs a resonator to filter unwanted frequencies. A resonator is a device that naturally oscillates at certain frequencies with greater amplitude than at others. A basic form of a resonator employed as a BPF includes a transmission line having a length equal to half of the electromagnetic wavelength of the frequency desired to be allowed to pass through. Thus, the length of the transmission line within a BPF is correlated to the resulting passband. Certain resonators include multiple transmission lines of one or more lengths.

As shown in FIG. 6A, two conductive transmission lines 610 and 620 are placed in close proximity such that they are electrically coupled to form a resonator. Thus, frequencies that resonate with both of the transmission lines will be filtered through the BPF 600. In order to reduce the physical size of the BPF 600, the transmission lines 610 and 620 can be configured in various shapes other than a straight line.

In the example embodiment illustrated in FIG. 6, the first transmission line 610 includes a U-shaped 630 portion positioned directly above a U-shaped portion 640 of the second transmission line 620. In an embodiment, an incoming RF signal is received by the first transmission line 610 and communicated to the second transmission line 620 via electromagnetic coupling along the respective U-shaped portions 630, 640. The received signal is filtered based on the resonant frequencies, which may be at least based on the length of the transmission lines, and an output signal includes the passband frequencies while attenuating stopband frequencies.

Figure 6B:
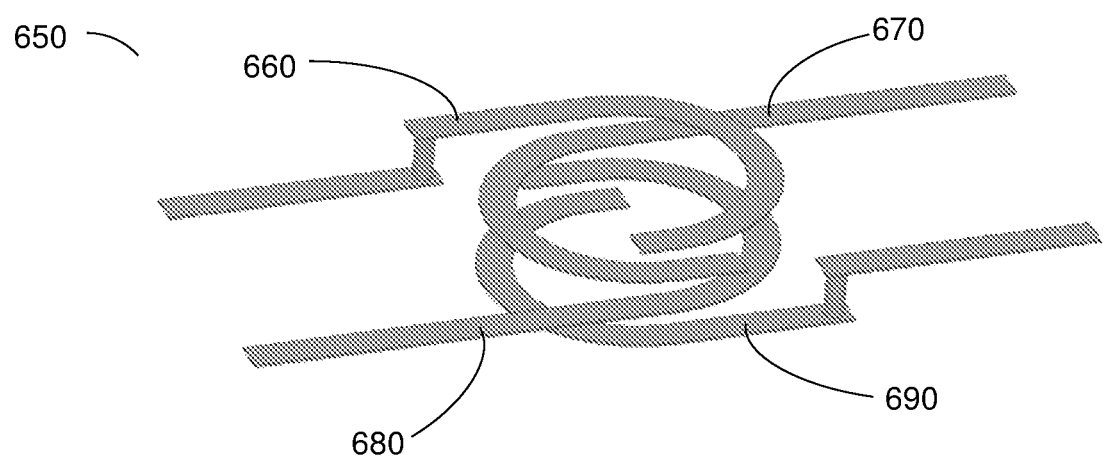
FIG. 6B is an example resonator of a band pass filter including multiple transmission lines according to an embodiment.

FIG. 6B is an example resonator of a BPF 650 including multiple transmission lines according to an embodiment. A first transmission line 660 includes a U-shaped portion aligned with a U-shaped portion of a second transmission line 670. Namely, the U-shaped portion of the first transmission line 660 is placed above an opposingly positioned U-shaped portion of the second transmission line 670, which is placed above an opposingly positioned U-shaped portion of a third transmission line 680, which is subsequently placed above an opposingly positioned U-shaped portion of a fourth transmission line 690.

In an embodiment of the BPF 650, the first transmission line 660 receives an incoming RF signal, and the fourth transmission line 690 outputs a filtered output signal. In an example embodiment, the radius of the U-shaped portion of each of the transmission lines is approximately 790 microns, the line thickness of each of the transmission lines is approximately 17 microns, and the distance between the U-shaped portion of adjacent transmission lines is approximately 350 microns. Such an example design provides a BPF with a passband of approximately 5.9-6.5 GHz.

The central frequency of the passband is directly correlated to the length of the transmission lines used within the BPF. In some BPFs, the transmission line length is fixed, and thus the central frequency of the passband is fixed as well.

However, in various implementations a tunable BPF is desired, where the frequency of the passband can be adjusted as needed. For example, wireless cellular networks for mobile phones often operate on multiple frequency bands, and cellular towers can be configured to transmit and receive data over multiple frequencies depending on both the licensed spectrum rights within a particular country, and the wireless carrier providing service to a specific mobile phone using those spectrum rights. If a user having a single mobile phone wishes to use that device in two countries having different usable frequencies for cellular usage, it would be advantageous for the receiver within the phone to be configured to be able to adjust an internal BPF depending on the location of use.

In an embodiment, the physical length of the transmission lines of the BPF are adjustable by various means, resulting in a BPF having a tunable passband.

Figure 7A:
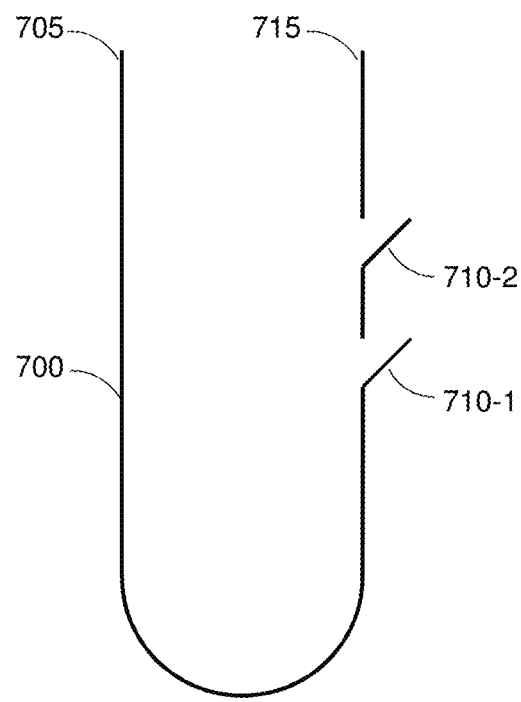
FIG. 7A is a schematic diagram of a transmission line of adjustable length via one or more electronic switches according to an embodiment.

FIG. 7A shows a schematic diagram of a transmission line 700 of adjustable length via one or more electromagnetic switches 710 according to an embodiment. As each switch 710 is placed at a different point along the transmission line 700, the more switches 710 that are installed within the transmission line 700, the greater the adjustment possibilities are for tunable passbands of a BPF using such a transmission line.

For example, a first switch 710-1 may be placed in an open position, and thus the effective transmission line 710 length extends from a first end 705 to the end of the first switch 710-1. Alternatively, the first switch 710-1 may be placed in a closed position (not shown), and the second switch 710-2 opened, where the effective length extends from the first end 705 to the second switch 710-2. Further, if both switches 710-1 and 710-2 are kept in a closed position, the effective length of the transmission line 710 extends from a first end 705 to a second end 715. Thus, such a transmission line 700 equipped with two switches produces three length possibilities, where each length corresponds to a different passband frequency.

The resonant frequency of the transmission line 710 is dependent on the electrical length of the transmission line, where a quarter wavelength of the frequency, i.e., λ/4, is equal to the length of the transmission line 710. Thus, an increase in transmission line length would result in a frequency shift of a quarter wavelength.

Figure 7B:
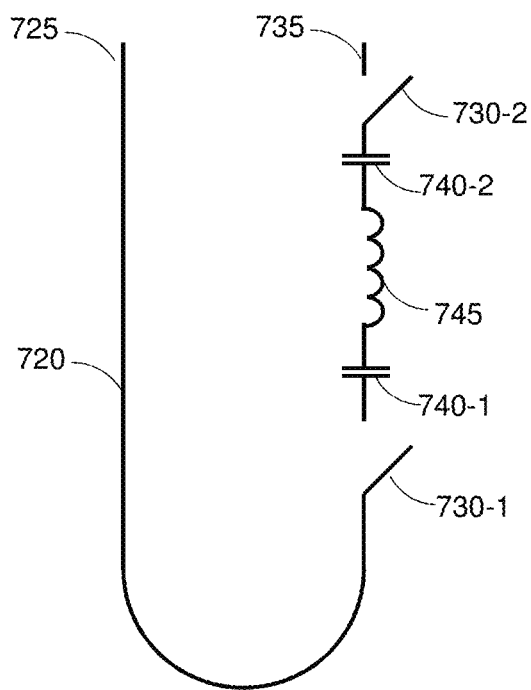
FIG. 7B is a schematic diagram of a transmission line of a tunable band pass filter according to an embodiment.

In addition to the switches, lumped elements, such as capacitors and inductors can be incorporated into transmission lines. FIG. 7B shows a schematic diagram of a transmission line 720 of a tunable BPF according to another embodiment. The transmission line 720 may include one or more switches 730, capacitors 740 and inductors 745. As with the embodiment discussed above in FIG. 7A, the switches 730-1 and 730-2 may be used in an open or closed position to adjust the physical length of the transmission line 720, extending from a first end 725 to a second end 732, or to either a first switch 730-1 or second switch 730-2. It should be noted that while two switches are used both in FIG. 7A and FIG. 7B, the claimed embodiments are not limited to two switches, and may include one or more switches.

Additionally, one or more capacitors 740-1 and 740-2, or one or more inductors 745 may be introduced into the transmission line 720. The lumped element model may be implemented to describe the transmission line, where the incorporation of lumped elements represents the capacitors 740 and inductors 745. Such elements allow for a "virtual" change of the physical length of the transmission line 720. Such change shifts a center frequency of the passband when the transmission line 720 is used within a BPF. The properties of each of these component, i.e., the switches 730, the capacitors 740, and the inductors 745, may be adjusted to achieve a desired passband. In an embodiment, the capacitors 740 may be variable capacitors, where parameters such as capacitance may be adjusted, e.g., through a mechanical or an electronic means. For example, the distance between plates or the plate surface area may be changed, affecting the total capacitance, and therefore the theoretical length of the transmission line 720.

More specifically, the resonant frequency of the transmission line 720 can be changed without changing its physical length by adding inductance or capacitance in series with the transmission line. This is achieved through lumped-impedance loading. Resonance occurs when capacitive and inductive reactance overcome each other. Thus, the resonance frequency equation can be represented as:

$$f_r = \frac{1}{2\pi\sqrt{LC}}$$

Adding capacitive or inductive load results in the lowering of the resonant frequency. Alternatively, in order to keep the same resonant frequency with the added capacitive or inductive load, the transmission line should be shortened. In this manner, capacitive and inductive loads can be an effective way to change resonant frequency of the transmission lines.

Figure 7C:
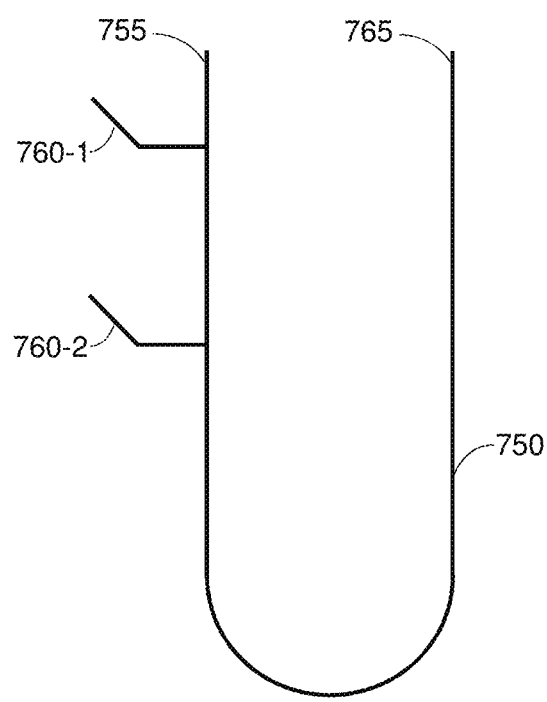
FIG. 7C is a schematic diagram of transmission line having multiple feeding points according to an embodiment.

FIG. 7C shows a schematic diagram of transmission line 750 having multiple feeding points 760 according to another embodiment. The transmission line 750 has a first end 755 and a second end 765, and additionally may include one or more feeding points 760, where the feeding points 760 are distinct from the first end 755 and the second end 765.

In an embodiment, a first feeding point 760-1 is positioned closed to the first end 755, and a second feeding point 760-2 is position farther away from the first end 755. Thus, the transmission line's effective length may be adjusted by determining if the transmission begins with the first end 755, the first feeding point 760-1, or the second feeding point 760-2, where the transmission line will always terminate at the second end 765. Further adjustment of the physical length of the transmission line 750 can be achieved by incorporating several feeding points with electronic switches. In such a case, specific Input and Output feeding points can be connected to the transmission line 750 with their respective switches.

In an embodiment, the tunable BPF includes two transmission lines, where each transmission line is in a U-shape, and where the first transmission lines is electromagnetically coupled with the second transmission line. In a further embodiment, the transmission lines are linearly shaped. It should be noted, however, that the transmission lines may be arranged in any of a variety of shaped, and the aforementioned examples are in no way meant to be limiting.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A tunable band pass filter (BPF), comprising:
   a first transmission line electromagnetically coupled to a second transmission line, wherein a length of at least one of the first transmission and the second transmission line is adjustable, and wherein a frequency of a passband of the tunable BPF is directly related to the length of the adjustable transmission line;
   wherein the first transmission line and the second transmission line each contain a U-shaped portion, and wherein the U-shaped portion of the first transmission line and the U-shaped portion of the second transmission are alternating in direction and are aligned, such that the U-shaped portion of the first transmission line is placed above an opposingly positioned U-shaped portion of the second transmission line.

2. The tunable BPF of claim 1, wherein the adjustable transmission line further comprises:
   at least one electromagnetic switch disposed along the adjustable transmission line, wherein the electromagnetic switch is configured to be placed in an open position or in a closed position.

3. The tunable BPF of claim 1, wherein the adjustable transmission line further comprises:
   at least one inductor having an adjustable inductance.

4. The tunable BPF of claim 1, wherein the adjustable transmission line further comprises:
   at least one capacitor having an adjustable capacitance.

5. The tunable BPF of claim 1, wherein the adjustable transmission line further comprises:
   at least one feeding point, where the at least one feeding point is distinct from a first end and a second end of the adjustable transmission line.

6. The tunable BPF of claim 1, wherein the first transmission line is electromagnetically coupled to the second transmission line such that the coupling produces a passband of certain frequencies within an input transmission signal that are allowed, and at least one stopband of certain frequencies that are prohibited.

* * * * *